United States Patent [19]

Yamazaki

[11] Patent Number: 5,137,868
[45] Date of Patent: Aug. 11, 1992

[54] METHOD FOR PREPARING A SUPERCONDUCTING DEVICE

[75] Inventor: Shunpei Yamazaki, Tokyo, Japan

[73] Assignee: Semiconductor Energy Laboratory Co., Ltd., Kanagawa, Japan

[21] Appl. No.: 557,705

[22] Filed: Jul. 25, 1990

Related U.S. Application Data

[62] Division of Ser. No. 187,044, Apr. 27, 1988, Pat. No. 4,959,345.

[30] Foreign Application Priority Data

May 6, 1987 [JP] Japan .................. 62-111611

[51] Int. Cl.⁵ .......................... B05D 5/12; B05D 3/06
[52] U.S. Cl. ................................ 505/1; 505/730; 505/702; 427/62; 427/53.1; 427/54.1; 427/125; 427/250; 427/419.2; 427/419.3; 427/404; 357/5; 250/492.3
[58] Field of Search .................. 505/1, 730, 702; 427/62, 63, 404, 419.3, 419.2, 53.1, 54.1, 124, 125, 250, 38; 250/492.2, 492.3; 357/5

[56] References Cited

U.S. PATENT DOCUMENTS 4,569,855 2/1986 Matsuda et al. .................. 427/35
4,624,737 11/1986 Shimbo ............................ 156/643

FOREIGN PATENT DOCUMENTS 61-168530 7/1986 Japan .

OTHER PUBLICATIONS

Jin et al, "High Tc superconductors-composite wire", Appl. Phys. lett. 51(3) Jul. 1987, pp. 203-204.
Meyer, III et al "Spectroscopic evidence for passivation of the $La_{1.85}Sr_{0.15}CuO_4$ surface with gold", Appl. Phys. lett. 51(14) Oct. 1987 pp. 1118-1120.

*Primary Examiner*—Shrive Beck
*Assistant Examiner*—Roy V. King
*Attorney, Agent, or Firm*—Sixbey, Friedman, Leedom & Ferguson

[57] ABSTRACT

A method for manufacturing a superconducting device comprises the steps of forming a blocking film by means of an optical vapor deposit reaction on the surface of an oxide superconducting material; and then adding oxygen into the oxide superconducting material by the implementation of a heat treatment.

12 Claims, 2 Drawing Sheets

METHOD FOR PREPARING A SUPERCONDUCTING DEVICE

This is a divisional application of Ser. No. 07/187,044, filed Apr. 27, 1988, now U.S. Pat. No. 4,959,345.

BACKGROUND OF THE INVENTION

1. Field of the Invention

The present invention relates to a method for preparing a solid device for use as an oxide superconducting material, and more particularly to a method for preparing a solid device, the surface of which is utilized for oxide superconducting material wherein an important improvement is imparted to the properties of the material at the surface or portion close to the surface, to provide a highly reliable surface-utilizing-device.

2. Description of the Related Art

Recently, considerable attention has been directed toward oxide superconducting materials. This began with the development of a Ba-La-Cu-O type of oxide superconducting material in the IBM research laboratories in Zurich, Switzerland. In addition to this, an yttrium type of oxide superconducting material is also known, which has provided the obvious possibility for the practical application of a solid device at the temperature of liquid nitrogen.

On the other hand, superconducting materials using metals such as $Nb_3Ge$ have been well known conventionally. Trials have been conducted in fabricating solid devices such as the Josephson element using this metal superconducting material.

After a dozen years of research, a Josephson device using this metal is close to being realized in practice. However, the temperature of this superconducting material at which the electrical resistance becomes zero (which is hereinafter referred to as Tco) is extremely low, that is 23° K., so that liquid helium must be used for cooling. This means that practical utility of such a device is doubtful.

With a superconducting material made of this metal, the components on both the surface and in the bulk of the material can be made completely uniform because all the material is metal.

On the other hand, when the characteristics of the oxide superconducting material which has been attracting so much attention recently are examined, a deterioration of the characteristics (lowering of reliability) is observed at the surface or portion close to the surface (roughly 200 Å deep), in comparison with the bulk of the material.

It has been possible to prove experimentally that the reason for this is that the oxygen in the oxide superconducting material can be easily driven off.

Further, when observed with an electron microscope, an empty columnar structure is seen with an inner diameter of 10 Å to 500 Å, and usually 20 Å to 50 Å in the oxide superconducting material, and in other words, the oxide superconducting material is found to be a multiporous material having indented portions in micro structure. For this reason the total area at the surface or portion close to the surface is extremely large, and when this oxide superconducting material is placed in a vacuum, the oxygen is broken loose as if absorbed gas was driven off.

The basic problem is determined that whether the material has superconducting characteristics or simply normal conducting characteristics is dependent on whether the oxygen is present in ideal quantities or is deficient.

SUMMARY OF THE INVENTION

An object of the present invention is to provide, with due consideration to the drawbacks of such conventional devices, a method for preparing a superconducting device which is kept superconductive at the surface or portion close to the surface of the oxide superconducting material.

This is accomplished in the present invention by the provision of a blocking film (passivation film), which is uniformly coated over the spaces or micro-holes in the surface portion of the superconducting material, to prevent the removal of oxygen from that surface.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Figure 1A:
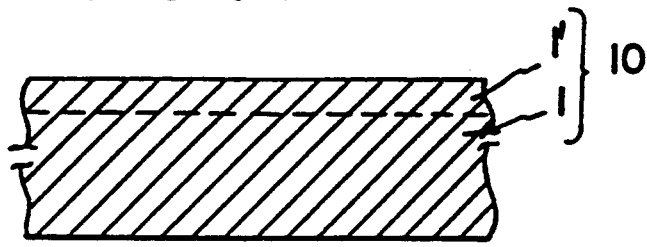
FIG. 1 (A), 1 (B), 1 (C), 1(D) and FIG. 1 (E) are diagrams indicating the method of preparing the superconducting device of the present invention and showing the distribution of the oxygen concentration.
Figure 1B:
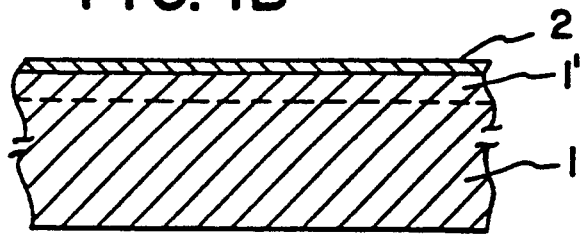
Figure 1C:
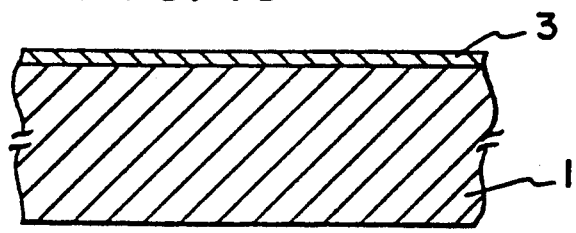

In the embodiments of the present invention, a blocking film or passivation film is uniformly coated over the spaces or micro-holes in the surface portion of the superconducting material, to prevent the removal of oxygen from that portion. Subsequently, a means is added by which the amount of oxygen in the inside surfaces of the superconducting material which tend to become oxygen deficient, can be precisely controlled. The superconducting material therefore has the same conductivity characteristics at the surface portion as at the internal portion.

In the present invention, a film is formed on the surface of the superconducting material at a thickness of 10 Å to 2 μm using an optical CVD method superior in stepped coverage, which is a method of exciting a reactive gas using ultraviolet light for coating a film onto a film forming surface. In particular, if this film is to be an insulated or half-insulated film for use in a Josephson element, it is formed at a thickness of 10 Å to 50 Å. Also, in the case where it is to be used as a passivation film, it is formed in a thickness of from 1000 Å to 2 μm.

After this, by means of methods such as the ion injection method or hot oxidation method, oxygen is added onto the surface or portion close to the surface, and the entire body is heat treated, so that the added oxygen is positioned in the appropriate atom location. In addition, this film is converted by heat treatment to a highly dense insulating material to provide a more complete blocking layer. This film is oxidized on a metal or semiconductor and is formed to function as an insulating film. Further, by solid phase to solid phase diffusion of the oxygen in this film, that is diffusion of the oxygen from a solid film into another ceramic which is solid, the oxygen concentration in the region at the surface or close to it, generally at a depth of about 200 Å, can be appropriately controlled.

The films used for this purpose may be insulating films such as silicon nitride, aluminum nitride, oxidized aluminum, oxidized tantalum, oxidized titanium and the like.

In addition, a metal or semiconductor which becomes an oxidized insulating film after oxidizing treatment can be used as this film. Specific examples are, in a metal, aluminum, titanium, copper, barium, yttrium, or in a semiconductor, silicon or germanium. These materials, by oxidation, can be made into aluminum oxide, titanium oxide, tantalum oxide, copper oxide, barium oxide, and yttrium oxide. Also, silicon can be converted into silicon oxide, and germanium into germanium oxide.

With the present invention, an oxide superconducting material formed into tablets, or a superconducting material formed into a thin film can be used. Especially with the use of a thin film structure, the screen printing method, sputtering method, MBE (molecular beam epitaxial) method, CVD (chemical vapor deposition) method, optical CVD method, and the like can be used.

One example of an oxidized superconducting material used in the present invention can be generally represented as $(A_{1-x}B_x)_y Cu_z O_w$, where $x=0$ to 1, $y=2.0$ to 4.0 or, preferably, 2.5 to 3.5, $z=1.0$ to 4.0 or, preferably, 1.5 to 3.5, and $w=4.0$ to 10.0 or, preferably, 6.0 to 8.0. A is one or a plurality of elements which can be selected from the group of Y (yttrium), Gd (gadolinium), Yb (ytterbium), Eu (europium), Tb (terbium), Dy (dysprosium), Ho (holmium), Er (erbium), Tm (thulium), Lu (lutetium), Sc (scandium), and other elements in Group III of the Periodic Table. B can be selected from among elements in Group IIa of the Periodic Table, such as Ra (radium), Ba (barium), Sr (strontium), Ca (calcium), Mg (magnesim), and Be (beryllium). In particular, as a specific example, $(YBa_2)Cu_3O_{6-8}$ can be used. In addition, lanthanide elements or actinide elements in the Periodic Table other than those outlined above can be used as A.

In the present invention, when the insulating film is of a thickness capable of causing a tunnel current of 5 Å to 50 Å to flow, another superconducting material can be positioned on the upper surface of this insulating film to provide a Josephson element structure.

In addition, it can also be used as a passivation film, that is a film to prevent deterioration, at a thickness of from 1000 Å to 2 μm.

Specifically, after the film is formed on the oxide superconducting material, oxygen can be added, or, added oxygen can be positioned in an appropriate location, by use of a heat treatment at from 300° C. to 900° C., for example 500° C., for 0.5 to 20 hours, for example, 3 hours, in an atmosphere of inert gas, air, or oxygen, so that the surface of the material or the portion close to the surface can be superconductive.

As a result, the oxygen concentration of this surface can be maintained in an ideal status when maintained at the temperature of liquid nitrogen. Specifically, a passivation film can be created.

In this way, the problem which has existed up until the present time, that is, the problem that the superconducting state close to the surface of an oxide superconducting material disapears for unknown causes, is corrected, and the superconductive state of the surface can be effectively utilized with long-term stability.

As a result, the surface utilizing device, especially a Josephson element, can be activated with long term stability and high reliability.

FIRST EXAMPLE

Now referring to FIG. 1 (A) to FIG. 1 (E), the structure of a first example of the present invention and the characteristics of the relative distribution of the concentration of oxygen in this embodiment are shown.

FIG. 1(A) shows a superconducting material, for example $YBa_2Cu_3O_{6-8}$. The copper component may be 3 or less. The starting material (FIG. 1(A) (1)) was formed from such a superconducting material in tablet or thin film form, having a monocrystalline or polycrystalline structure.

When this material was placed in a vacuum in a vaccum device, the oxygen in the area close to the surface (1') was removed, so that the deterioration of electrical characteristics occurred in a depth range up to about 200 Å.

Figure 1D:
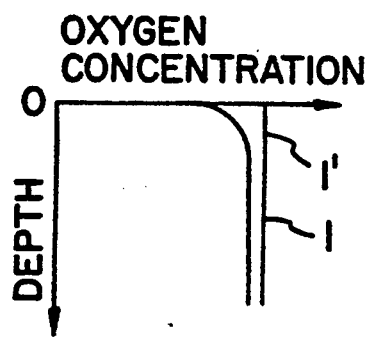
Figure 2A:
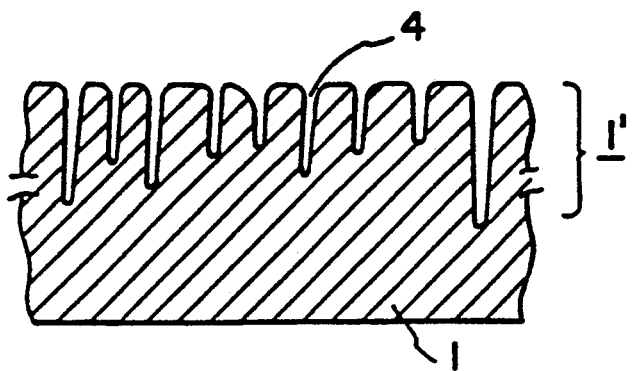
FIG. 2 (A) and FIG. 2 (B) are enlarged sectional drawings of a superconducting material for implementing the method of the present invention.
Figure 2B:
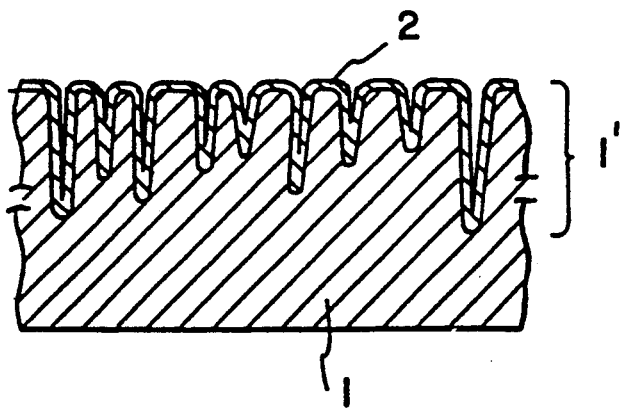

When this surface was observed through an electron microscope, deep spaces or micro-holes were seen to be formed from the surface to the interior of the material, as shown in FIG. 2(A). These spaces have an internal diameter of 10 Å to 500 Å, and usually from 20 Å to 50 Å. The oxygen density corresponding to FIG. 1(A) is shown in FIG. 1(D). And, it has been confirmed that the oxygen at the surface or close to the surface can be easily removed. A region 1 in the diagram had a normal oxygen concentration, while there was a deficiency of oxygen in a region 1'. The depth of the region 1' with a deficiency of oxygen was 50 Å to 2000 Å. This depth varied depending on the type, structure, and density of the superconducting material, but was generally about 200 Å.

On the surface of this material, a silicon nitride film, a silicon oxide film, or an aluminum film was formed to a depth of 5 Å to 50 Å, for example, 20 Å, by the CVD method, in which a reactive gas is optically excited using ultraviolet light or a laser beam, so that a film is formed on the treated surface. The silicon nitride was formed at a temperature of 250° C. and a pressure of 10 torr, from the following reaction:

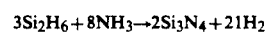

$$3Si_2H_6 + 8NH_3 \rightarrow 2Si_3N_4 + 21H_2$$

In this way, it was possible to form a film so that the inside of the spaces was adequately coated. In addition to this treatment, ion injection was also carried out. A lower accelerating voltage of 10 KV to 30 KV was applied and doping was carried out, so that the oxygen concentration became uniform at a concentration of $1 \times 10^{17} \text{ cm}^{-3}$ to $1 \times 10^{21} \text{ cm}^{-3}$.

Heat treatment was applied to the whole body in an atmosphere of oxygen at 300° C. to 900° C., for example 500° C. for about 5 hours.

Figure 1E:
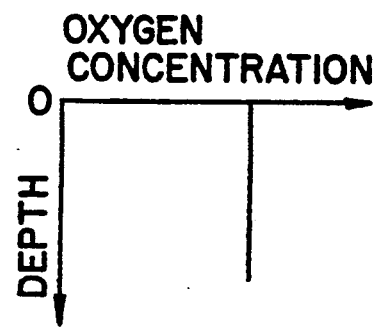

As a result of this heat treatment, it was possible to impart the same oxygen density to the surface portion as in the internal portion as shown in FIG. 1(E).

A sample of this embodiment of the present invention was removed from the heat treatment condition and once more stored in a vacuum. A blocking layer 3 formed in this manner on the surface or portion close to the surface of the superconducting material made it possible to produce a highly reliable device, with no oxygen deficiency in that portion.

This insulating film was extremely effective as a passivation film.

SECOND EXAMPLE

In a second example of the present invention, silicon oxide was used for the film.

The silicon oxide was formed at a temperature of 200° C. using ultraviolet light at 185 nm and a pressure of 20 torr, implementing a photochemical reaction as indicated in the following equation:

$$SiH_4 + 4N_2O \rightarrow SiO_2 + 4N_2 + 2H_2O$$

The superconducting material was the same as in the first example. Subsequently, a heat treatment in oxygen at 450° C. was carried out and a suitable oxygen concentration obtained.

THIRD EXAMPLE

In a third example of the present invention, metallic aluminum was used for the film.

The aluminum film was formed at a temperature of 250° C. and a pressure of 3 torr, using a photo-CVD process at a wavelength of 185 nm, implementing a photochemical reaction as indicated in the following equation:

$$2Al(CH_3)_3 + 3H_2 \rightarrow 2Al + 6CH_4$$

Subsequently, the material was annealed in oxygen at 500° C. for 3 to 10 hours, and, as in the first example, the alminum on the surface was converted to alumina, and the concentration of oxygen was optimized throughout the superconducting material.

An oxide superconducting material is used in the present invention, and the surface, when examined with a electron microscope, is seen to have a large number of micro-holes or spaces. It is necessary to fill the inside of the spaces or the micro-holes with a solid material to have a high degree of reliability. A film produced by the vacuum evaporation method, hot CVD method, sputtering method and the like cannot cover the internal surface. However, when the photo-CVD method is used in the present invention, an extremely superior coating is possible, so that an extremely minute coating can be obtained on the top surface of the porous substrate material used. In addition, by making this coating more dense, or converting to an oxidized insulating material, a more perfect state can be obtained, and at the same time it is possible to fill the micro-holes or spaces. In addition, this method by which an improved, dence, superconducting material is obtained is extremely effective because the manufacturing process is very easy.

In the present invention the term "oxide superconducting material" is used, wherein it is clear that in the technical concept of the present invention, the crystal structure may be either monocrystalline or polycrystalline. In particular, in the case of a monocrystalline structure, epitaxial growth may occur on the substrate for use as the superconducting material.

In the present examples, after the film has been formed, oxygen is injected into the superconducting material by ion injection. However, it is possible to add oxygen to the surface or portion close to the surface of the superconducting material in advance by the ion injection method or the like, and to form the film afterward, before effectively positioning the added oxygen in the appropriate atom location by a hot oxidation process when fabricating the superconducting material.

What is claimed is:

1. A method for manufacturing a superconducting device to improve the uniformity of oxygen concentration, the method comprising the steps of:
   providing an oxide superconducting material having a surface;
   depositing a blocking film having a thickness of 5 Å to 2 μm on the surface of the oxide superconducting material; and
   heating said superconducting material with said blocking film at a temperature from 300°-900° C. wherein said blocking film is made from an insulating material or a material which becomes an oxidized insulating material after said heating step.

2. A method as in claim 1 further comprising the steps of adding oxygen into said oxide superconducting material by means of ion implantation.

3. The method of claim 1 wherein said blocking film is an insulating material selected from the group consisting of silicon nitride, aluminum nitride, aluminum oxide, tantalum oxide and titanium oxide.

4. The method of claim 1 wherein said blocking film comprises a metal of an oxide thereof, wherein said metal is selected from the group consisting of aluminum, titanium, copper, barium and yttrium.

5. The method of claim 1 wherein said blocking film comprises a semiconductor or an oxide thereof wherein said semiconductor is silicon or germanium.

6. The method of claim 1 wherein said heating step is performed in an atmosphere of inert gas, air or oxygen.

7. The method of claim 1 wherein said blocking film is formed by a photo-CVD.

8. The method of claim 1 wherein said superconducting material is represented by a general formula $$(A_{1-x}B_x)_y Cu_z O_2,$$

where $0 < x < 1$, $2 < y < 4$, $1 < z < 4$ and $4 < w < 10$, and
A is one or more elements selected from the group consisting of Sc, Y lanthanides and actinides and B is one or more elements selected from the group consisting of Ba, Sr, Ca, and Mg.

9. The method of claim 1 wherein said superconducting material is formed by a screen printing method, sputtering method, MBE method or CVD method.

10. A method for manufacturing a superconducting device to improve the uniformity of oxygen concentration, the method comprising the steps of:
    providing an oxide superconducting material;
    coating a surface of said oxide superconducting material with a blocking film with a thickness from 1000 Å to 2 μm, said film comprising a material selected from the group consisting of aluminum, titanium, copper, barium, yttrium, silicon, germanium, and a compound thereof; and
    heating said superconducting material with said blocking film at a temperature from 300° to 900° C.

11. A method for manufacturing a superconducting device to improve the uniformity of oxygen concentration, the method comprising the steps of:
    providing an oxide superconducting material;
    coating a surface of said oxide superconducting material with a blocking film with a thickness from 5 to 50 μm, said film comprising a material selected from the group consisting of aluminum, titanium, copper, barium, yttrium, silicon, germanium, and a compound thereof; and
    heating said superconducting material with said blocking film at a temperature from 300° to 900° C.

12. The method of claim 11 further comprising the step of forming a superconducting material on said blocking film so that a Josephson junction is formed.

* * * * *